United States Patent
Park et al.

(10) Patent No.: US 6,566,198 B2
(45) Date of Patent: May 20, 2003

(54) CMOS STRUCTURE WITH NON-EPITAXIAL RAISED SOURCE/DRAIN AND SELF-ALIGNED GATE AND METHOD OF MANUFACTURE

(75) Inventors: Heemyong Park, LaGrangeville, NY (US); Fariborz Assaderaghi, Mahopac, NY (US); Atul C. Ajmera, Wappingers Falls, NY (US); Ghavam G. Shahidi, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/821,520

(22) Filed: Mar. 29, 2001

(65) Prior Publication Data

US 2002/0142551 A1 Oct. 3, 2002

(51) Int. Cl.[7] ............................................ H01L 21/336
(52) U.S. Cl. .................. 438/259; 438/259; 438/480; 438/270; 438/271; 438/589; 257/330
(58) Field of Search ................. 438/480, 259, 438/270–71, 589; 257/330

(56) References Cited

U.S. PATENT DOCUMENTS

| | | | | |
|---|---|---|---|---|
| 6,022,781 A | * | 2/2000 | Noble, Jr. et al. | 12/96 |
| 6,395,589 B1 | * | 2/2000 | Yu | 438/183 |
| 6,051,473 A | * | 4/2000 | Ishida et al. | 438/300 |
| 6,150,244 A | * | 11/2000 | Ni | 438/564 |
| 6,228,729 B1 | * | 5/2001 | Ni | 438/300 |
| 6,307,230 B1 | * | 10/2001 | Chatterjee et al. | 257/327 |
| 6,218,711 B1 | * | 4/2002 | Yu | 257/384 |
| 6,368,927 B1 | * | 5/2002 | Lee | 438/300 |

OTHER PUBLICATIONS

Chen et al "SLOTFET fabrication of self–aligned sub–100nm fully–depleted SOI CMOS" SOI Conference, 2000 IEEE International, 2000 pp.: 82–83.*

Choi et al. "30 nm ultra–thin–body SOI MOSFET with selectively deposited Ge raised S/D" Device Research Conference, 2000. Conference Digest. 58th DRC, 2000 pp.: 23–24.*

Ieong et al. "Comparison of raised and Schottky source/drain MOSFETs using a novel tunneling contact model" Electron Devices Meeting, 1998. IEDM '98 Technical Digest., International, 1998 p. 27.6.1–27.6.4.*

* cited by examiner

Primary Examiner—Matthew Smith
Assistant Examiner—Granvill D. Lee, Jr.
(74) Attorney, Agent, or Firm—Whitham, Curtis & Christofferson, P.C.; Jay H. Anderson

(57) ABSTRACT

A CMOS structure and method of achieving self-aligned raised source/drain for CMOS structures on SOI without relying on selective epitaxial growth of silicon. In the method, CMOS structures are provided by performing sacrificial oxidation so that oxidation occurs on the surface of both the SOI and BOX interface. This allows for oxide spacer formation for gate-to-source/drain isolation which makes possible raised source/drain fabrication without increasing contact resistance.

17 Claims, 6 Drawing Sheets

CMOS STRUCTURE WITH NON-EPITAXIAL RAISED SOURCE/DRAIN AND SELF-ALIGNED GATE AND METHOD OF MANUFACTURE

BACKGROUND OF THE INVENTION

1. Field of the Invention

The present invention generally relates to CMOS structures and, more particularly, to a method of achieving high performance self-aligned low-resistance raised source/drain for CMOS on SOI, through differential thickness of source/drain and channel, without relying on selective epitaxial growth of silicon.

2. Background Description

Complementary Metal Oxide Semiconductors (CMOS) are electronic components used for Random Access Memory (RAM) and fast data switching. CMOS semiconductors are made of two complementary metal-oxide field effect transistors for high speed and low power use. While many designs have been developed, Silicon On Insulator has recently been of interest due to the high capacity of silicon for high-performance structure fabrication having the channel controllable with low gate voltages.

As silicon film thickness of Silicon On Insulator (SOI) is reduced, for high-performance CMOS fabrication, it becomes necessary to increase the thickness of source/drain regions above the SOI thickness. This principally results from the fact that, as the SOI film becomes thinner, there exists a reduced amount of Si material from which to form silicide for source/drain contacts. Additionally, thinner source/drain regions can degrade on-current due to increased series resistance.

To maintain or reduce the overall source/drain series resistance, including the silicide contact resistance, two methods have been used to form raised source/drain (RSD) structures. First, a method of selective epitaxial growth of silicon has been used that grows the silicon on the source/drain and the top of poly gates, leaving no silicon on gate sidewall spacers.

One key limitation of this method is that epitaxial growth must take place at temperatures as high as 750° C., which causes significant transient enhanced diffusion (TED) of major dopants. The unnecessary dopant redistribution in halo/extension regions degrades the performance of devices and short channel immunity. Moreover, with a very thin SOI film, it can be difficult to form epitaxial silicon without causing silicon agglomeration due to possible contamination of carbon in certain chemical vapor deposition tools.

Alternatively, a method of SiGe selective epitaxial growth on source/drain has been used, which provides a sizable Ge fraction. An advantage of this method is that it eliminates the TED of major dopents which may occur at high temperatures.

However, Ge is known to degrade silicide contact formation and contact resistance due to its inherent function as a diffusion barrier. In order to avoid this undesirable result, it is necessary to cap the surface of SiGe with additional epitaxial silicon, using a high temperature process, which may cause TED. High fraction Ge may increase spreading resistance of the RSD layer from the extension to silicide contact. Also, depending on the epi thickness, Ge fraction, and temperature, extended defects such as misfit dislocations can form at the interface between SiGe and Si film of SOI, which may lead to, among other things, junction leakage.

SUMMARY OF THE INVENTION

The present invention generally relates to CMOS structures and, more particularly, to a method of achieving self-aligned raised source/drain for CMOS on SOI without relying on selective epitaxial growth of silicon.

In one aspect of the present invention, a method of achieving self-aligned raised source/drain for CMOS on SOI is provided without relying on selective epitaxial growth of silicon.

A principal objective in accordance with a preferred embodiment of the present invention, is to provide a method of building a thicker source/drain without extraneous material formation with epitaxy. In the furtherance of this and other objectives, a method is provided for self-aligned etching of an existing SOI layer to form a channel region thinner than the unetched source/drain regions, instead of thickening the source/drain regions on thinned SOI layer.

A preferred embodiment of the present invention, to increase short-channel immunity for CMOS devices on partially-depleted SOI. In the furtherance of this and other objectives, the channel thickness is modulated as the gate length is reduced. To this end, a CMOS on a SOI is provided with controllable channel thickness to channel length ratios. For example, controlling the increase in channel thickness with shorter channel length.

Further objects, features and advantages of the invention will be apparent from the following detailed description taken in conjunction with the accompanying drawings.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

In the embodiments of the present invention, the CMOS structure is provided with a non-epitaxial raised source/drain and self-aligned gate. By using the method of the present invention, it is possible to form the CMOS structure with non-epitaxial raised source/drain.

Method of Formation of the Present Invention

Figure 1:
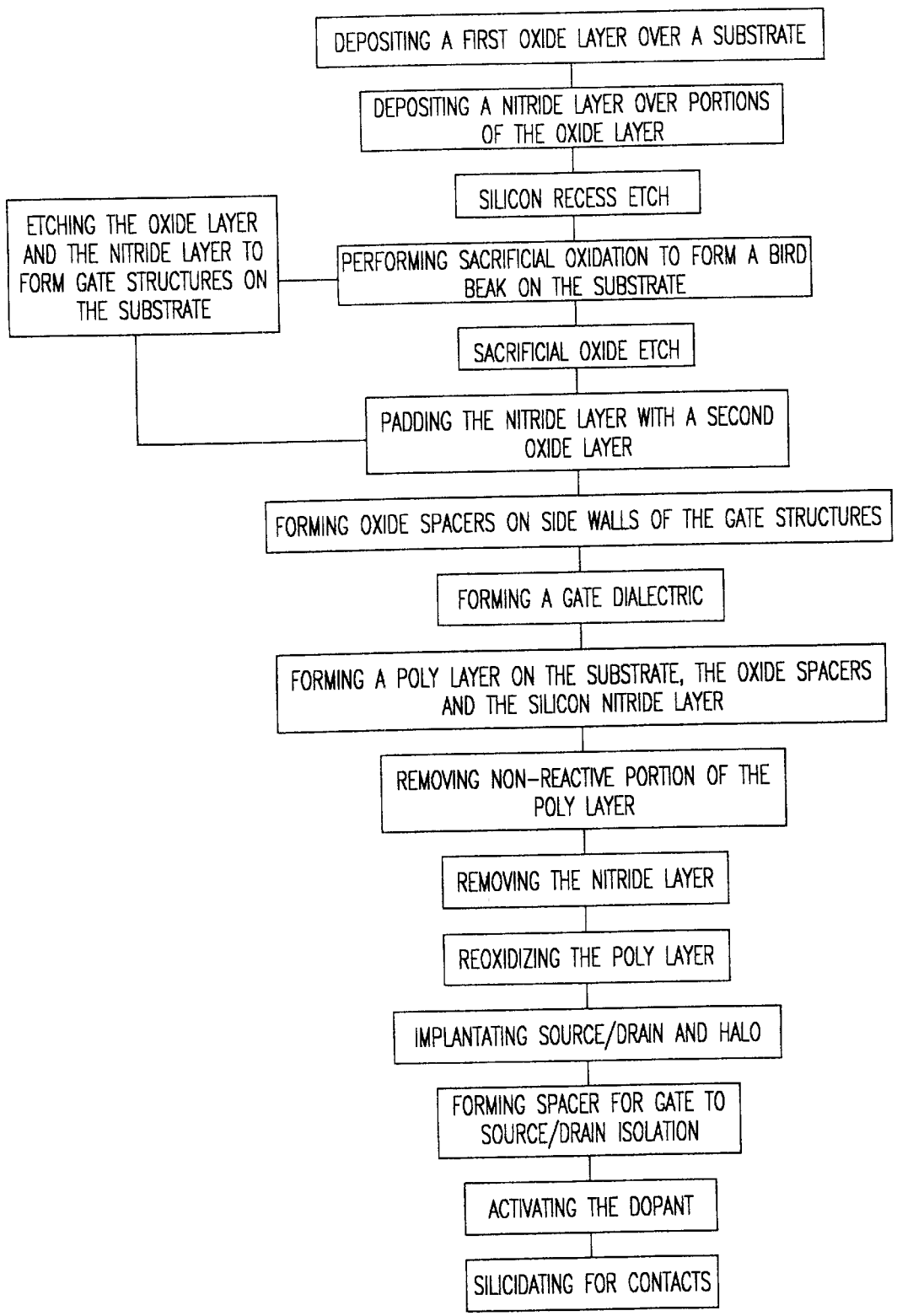
FIG. 1 shows an exemplary flow diagram of a process for forming a self-aligned raised source/drain for CMOS on SOI, of the present invention.

Referring now to the drawings, and more particularly to FIG. 1, there is shown a flow diagram of one exemplary embodiment of a fabrication process in accordance with the present invention. The fabrication process shown in FIG. 1 describes several embodiments, none of which are necessarily required in any one preferred embodiment but which still may be part of the present invention.

In process steps 100–200, an oxide and a nitride layer are deposited. See FIG. 2. The oxide is for buffering the stress from the nitride layer and also for etch stop. The thickness of nitride can be adjusted to match the final poly gate thickness and mask for poly gate definition. Therefore, in process step 100, insulating materials are formed along the sidewalls of the gate conductor lines.

These insulating materials may include, but are not limited to, an oxide as well as silicon nitride. The silicon nitride may be used for the formation of silicon nitride spacers, and may be deposited using reactive ion etching (RIE) techniques. A conformal silicon nitride layer is deposited on the oxide layer. The conformal nitride layer may also be formed over the active area and the isolation areas between the active areas.

In process step 300, a recess is etched through the oxide layer and the SOI in order to define the channel. See FIG. 3. The nitride etch is stopped on the oxide and remaining nitride is used as a mask to etch SiO and Si. An alternative embodiment of this step will be to etch the exposed silicon film entirely and perform selective epi/poly growth using the Si seeds on the sidewall. The partial growth of selective epi/poly, which results in channel thickness less than the initial SOI thickness, will define the channel. To obtain a high quality silicon epi in the channel, one can completely recrystalize the epi/poly layer by doing a high temperature anneal (above 1000° C.) after the epi/poly growth.

In process step 400, sacrificial oxidation is performed to form a bird's beak which is desirable for forming the spacer region at the corners of the gate in the final stages of the process. See FIG. 4. For the thin film SOI, the oxidation occurs not only on the surface but also at the buried oxide (BOX) interface. The mechanism by which this occurs may be oxide diffusion or the differential thermal effect. The thickness of the formed oxide on the BOX may be less in the smaller gate notch. This effect results in a relatively thicker channel for shorter gate length in the final structure. For partially-depleted operation of SOI devices, this modulation of channel thickness can be an advantage for better Vt rolloff control. Therefore, the channel thickness is gate/length dependent.

An optional step 500 would include, well doping by channel implantation, principally for long-channel Vt. See FIG. 5.

In process step 600, sacrificial oxide etching is performed. The surface of silicon is cleaned for gate oxide formation. The resulting contour of silicon near the gate edges is also achieved. See FIG. 6.

In process Step 700, a thin pad oxide deposition is performed to provide for the subsequent spacer process. See FIG. 7. In process step 800, Oxide spacer formation is provided for gate-to-S/D isolation and for reduction of fringing capacitance in the final device structure. See FIG. 8.

Process step 900 provides Gate dielectric formation. See FIG. 9. If a high-k dielectric is used, it is also deposited at the sidewalls, enclosing the poly gate, which is deposited at process step 800.

Process step 1000 provides for the deposition of the gate poly within the gate recess and on the interior sides and top surfaces of the nitride layer. See FIG. 10. Therefore, after the recess is filled, process step 1100 provides for the removal of polysilicon. In this process step, the polysilicon is polished back to the tops of the nitride layer, and even more preferably below the tops thereof. The polishing of the polysilicon is preferably performed by Chemical Mechanical Polishing (CMP). See FIG. 11.

In process step 1200, the nitride layer is etched off and poly reoxidation is performed in process step 1300. See FIGS. 12–13. An isotropic dry etch may be applied to recess the n+ amorphous/polycrystalline silicon to below the level of the capping nitride layer. In the former process step, the silicon is etched selectively to the capping nitride layer. In this manner there is minimal etching of the capping nitride layer. This step isolates the polysilicon stud between the gates from adjacent studs.

In process step 1400, S/D and halo implantation is performed. Depending on the SOI film thickness, details of this process will be different for fully-depleted and for partially-depleted devices. The optimal implantation process for fully-depleted devices may not involve concerns about gradual halo doping profiles. See FIG. 14.

Proces step 1500 provides for the formation of the Low-temperature spacer for gate-to-S/D isolation. This process is performed using a chemical vapor deposition (CVD) tooling process, preferably, plasma enhanced chemical vapor deposition (PECVD) at a suitable temperature, preferably, about 600° C. or lower. See FIG. 15.

Process step 1600 provides a Rapid Thermal Anneal (RTA) for dopant activation. A typical RTA may be performed at approximately 900–1000° C. for 5–30 seconds in either Ar or $N_2$. This may also serve as the first thermal step for the S/D and halo doping. See FIG. 16.

In process step 1700, Silicidation is performed for contacts. Without any Ge on the surface, potential problems of silicidation formation and/or contact resistance degradation are avoided. See FIG. 17.

Device Structure of the Present Invention

Referring now to FIGS. 2–17, the corresponding cross-sections of selected steps from the process flow diagram of FIG. 1 are now described. FIG. 18 shows the final structure of the present invention.

Figure 2:
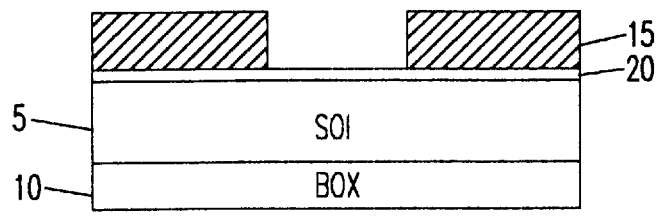
FIGS. 2–17 show the several stages of formation of the self-aligned raised source/drain for CMOS on SOI, in accordance with the steps of FIG. 1.

FIG. 2 shows an SOI 5 disposed on a buried oxide interface (BOX) 10 having gate conductor lines with a capping nitride material formed thereon. Specifically, the gate conductor includes a nitride layer 15 formed over an insulation layer 20, the oxide insulation layer 20 being disposed between said nitride layer 15 and said SOI 5. The insulating material may also be an oxide as well as silicon nitride. The insulation layers are preferably 150 nm, but may be in the range from approximately 30–300 nm in thickness. Also, the nitride layer may be approximately in the range of 50–300 nm and preferably 150 nm in thickness. If used, sidewall oxidation is preferably 5 nm but may range between approximately 1–10 nm in thickness.

Figure 3:
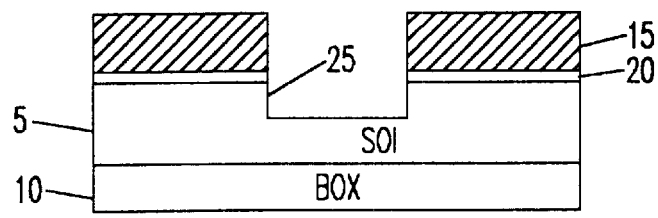

FIG. 3 shows channel definition with reactive ion etching (RIE) techniques. Further, the insulating material may be formed along the sidewalls of the gate conductor lines. These insulating materials may include, but are not limited to, an oxidation as well as silicon nitride.

Figure 4:
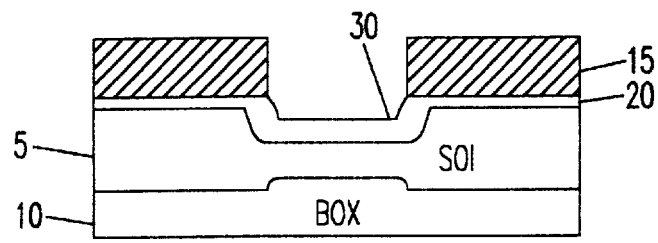

FIG. 4 shows sacrificial oxidation that results in a bird's beak 30 which is desirable for forming the spacer region at the corners of the gate in the final stages of the process. For the thin film SOI, the oxidation occurs not only on the surface but also at the BOX interface 10. The thickness of the formed oxide may be less in the smaller gate notch. This effect results in a relatively thicker channel for shorter gate length in the end. For partially-depleted operation of SOI devices, this modulation of channel thickness can be an advantage for better Vt rolloff control.

One of ordinary skill in the art would appreciate that the resulting channel provides the appropriate channel thickness to gate length ratio. In particular, the thicker the channel the shorter the gate length in the final structure.

Figure 5:
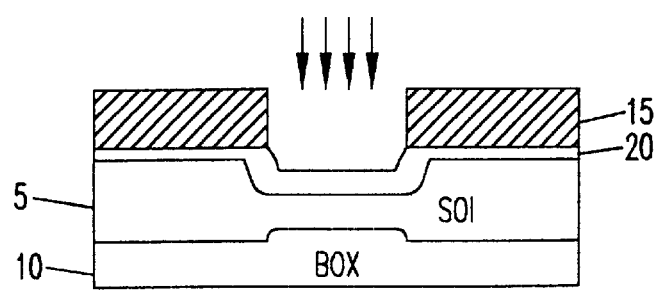

FIG. 5 shows the optional step of doping by channel implantation, principally for long-channel Vt.

Figure 6:
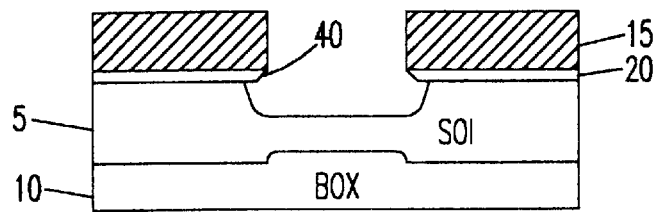

FIG. 6 shows sacrificial oxide etching of the silicon surface to clean it for gate oxide formation. The resulting contour 40 of silicon near the gate edges is also achieved.

Figure 7:
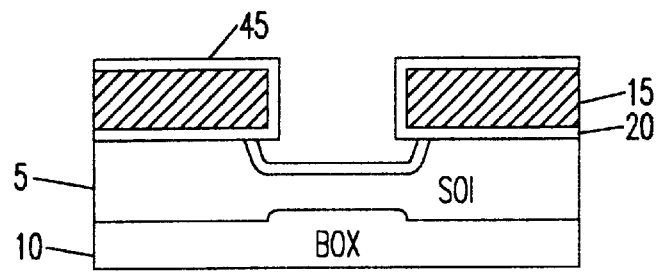

FIG. 7 shows a thin pad oxide 45 deposited on the nitride layer 15, to provide for the subsequent spacer process.

Figure 8:
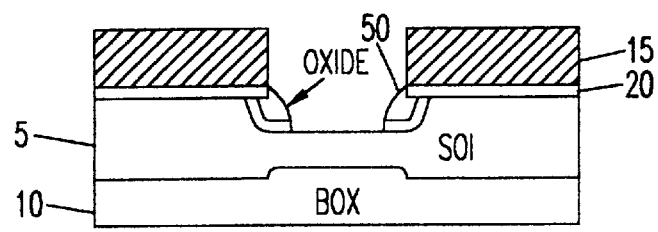

FIG. 8 shows the formation of spacers 50 between the gate conductor lines. The spacers 50 are preferably oxide spacers deposited using reactive ion etching (RIE) techniques. The spacer is preferably 30 nm in thickness but may range from approximately 10–100 nm in thickness. Oxide spacer formation is provided for gate-to-S/D isolation and for reduction of fringing capacitance in the final device structures.

Figure 9:
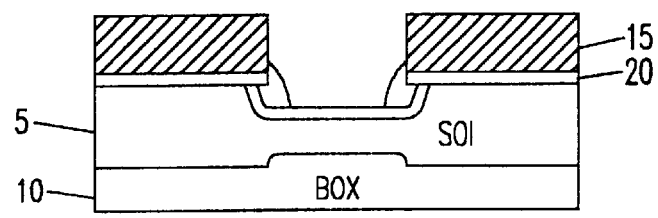

FIG. 9 shows the Gate dielectric formation. If high-k dielectric is used, it is preferably also deposited at the sidewalls, enclosing the poly gate.

Figure 10:
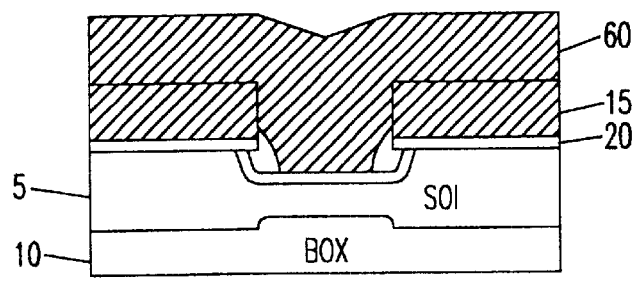

FIG. 10 shows a layer of polysilicon 60 deposited and annealed over the thus formed structure. The resulting polysilicon thickness is above the level of the formed gate conductor lines, but is polished back to the tops of the gate conductor lines, and preferably below the tops thereof. The polysilicon layer is preferably 300 nm in thickness but may range from approximately 100–800 nm in thickness.

Figure 11:
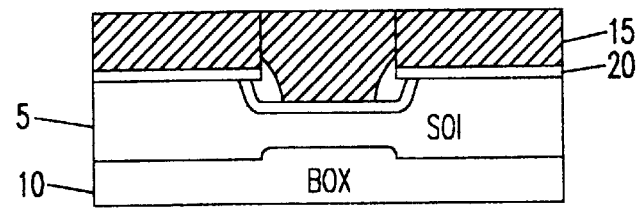

FIG. 11 shows the removal of the polysilicon 60 after the recess is filled. In this process step, the polysilicon 60 is polished back to the tops of the nitride layer 15, and even more preferably below the tops thereof. The polishing of the polysilicon 60 is preferably performed by Chemical Mechanical Polishing (CMP). An isotropic dry etch may be applied to recess the polysilicon 60 to below the level of the capping nitride layer 15.

Figure 12:
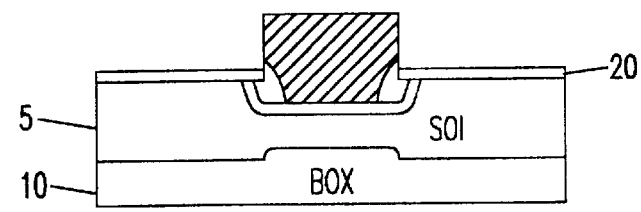

FIG. 12 shows the process of etching off of the nitride layer 15.

Figure 13:
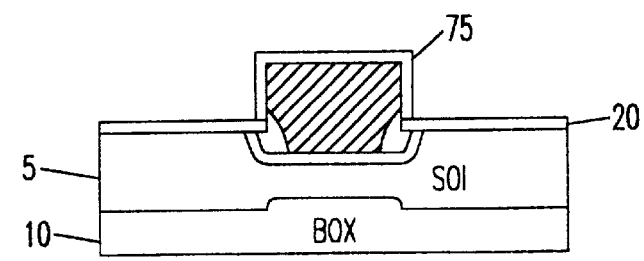

FIG. 13 shows TEOS layer 75 or other suitable oxide deposited on the poly layer 60. The oxide layer 75 is preferably 50 nm in thickness. The oxide layer 75 may be planarized, which is an optional step. In this embodiment, the polishing would be a "blind" polishing and the final oxide layer thickness would be above the gate conductor lines. The thickness of the oxide layer 75 may be in the range of approximately 30–100 nm.

Figure 14:
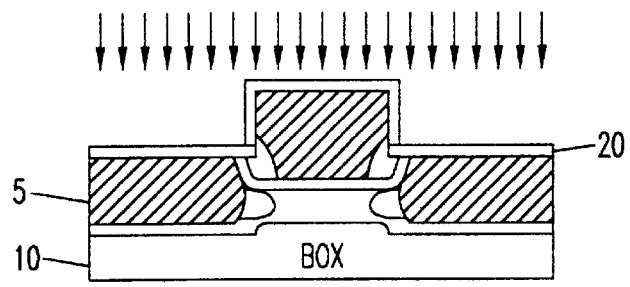

FIG. 14 shows S/D and halo implantation. Depending on the SOI film thickness, details of this process will be different for fully-depleted and for partially-depleted devices. The optimal implantation process for fully-depleted devices may not involve concerns about gradual halo doping profiles.

Figure 15:
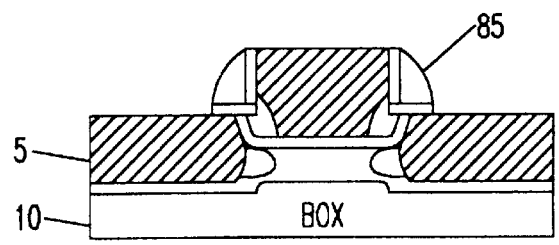

FIG. 15 shows the formation of the Low-temperature spacer 85 for gate-to-S/D isolation. The source/drain oxide range may be aproximately between 50–500 Å and preferably between 50–300 Å This process is performed using a chemical vapor deposition (CVD) tooling process, preferably, plasma enhanced chemical vapor deposition (PECVD) at a suitable temperature, preferably, about 600° C. or lower.

Figure 16:
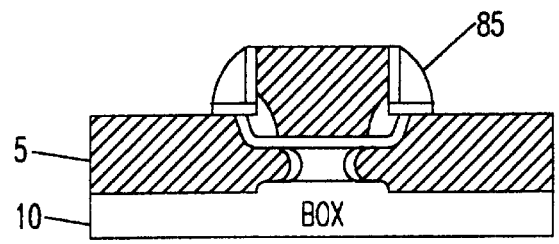

FIG. 16 shows a Rapid Thermal Anneal (RTA) for dopant activation. This may also serve as the first thermal step for the S/D and halo doping. In essence, the dopants in the silicon on insulator layer are redistributed through the channel region as a result of the anneal.

Figure 17:
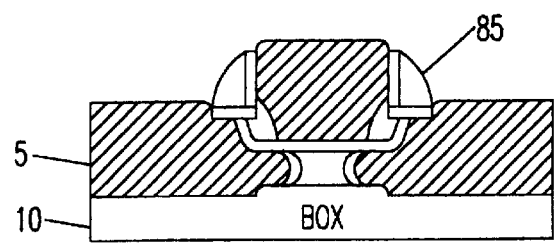
Figure 18:
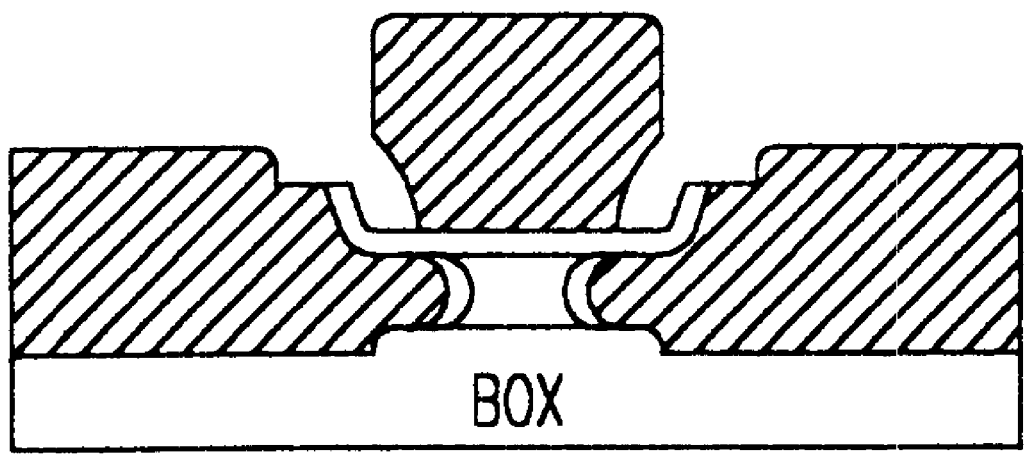
FIG. 18 shows the self-aligned raised source/drain for CMOS on SOI of the present invention.

FIG. 17 shows the silicidation for contact. Without any Ge on the surface, potential problems of silicidation formation and/or contact resistance degradation are avoided.

FIG. 18 shows the final structure of the present invention. In particular, a CMOS structure with non-epitaxial raised source/drain and self-aligned gate. Conventional back end processing is then performed.

While the invention has been described in terms of preferred embodiments, those skilled in the art will recognize that the invention can be practiced with modification within the spirit and scope of the appended claims.

Having thus described our invention, what we claim as new and desire to secure by Letters Patent is as follows:

1. A method of forming a raised source/drain field effect transistor including the steps of:
   etching a gate region in a layer of silicon of a first thickness sufficient for silicidation of contacts, so that the gate region has a second thickness corresponding to a desired channel thickness, wherein the second thickness is less than the first thickness;
   oxidizing the gate region to form a sacrificial oxide layer;
   removing the sacrificial oxide layer;
   forming inside spacers after removing the sacrificial oxide layer;
   forming a gate structure at said gate region; and
   forming drain and source structures adjacent said gate structure in regions of said first thickness.

2. The method of claim 1, further comprising the steps of:
   implanting dopants in said layer of silicon of said first thickness; and
   diffusing said dopant into said region of said second thickness.

3. The method of claim 1, further comprising the step of modulating said second thickness.

4. The method of claim 1, wherein the second thickness is dependent on the length of the gate region.

5. The method of claim 1, wherein the second thickness is dependent on the width of the gate region.

6. A method of forming a raised source/drain field effect transistor, the method comprising the steps of:
   forming a silicon on insulator layer having portions that define first and second recesses on top and bottom surfaces, respectively, of said silicon on insulator layer such that the silicon between the recesses define a channel region;
   forming a buried oxide interface, having a top and a bottom surface, the top surface of the buried oxide interface having a raised portion that engages the second recess on the bottom surface of the silicon on insulator layer;
   forming elevated source and drain regions, the elevated source and drain being formed above the top surface of the silicon on insulator layer; and
   forming a gate in the recess on the top surface of the silicon on insulator layer.

7. The method of claim 6, further comprising the steps of:
   implanting impurities in the silicon on insulator layer; and
   activating the impurities so that the dopant redistributes into the channel region.

8. The method of claim 6, further comprising the step of silicidating of contacts.

9. The method of claim 6, wherein the raised portion results from oxide growth.

10. The method of claim 6, wherein the dimensions of the raised portion of the buried oxide interface are dependent on the gate length.

11. The method of claim 10, wherein the oxide growth increases as channel length increases.

12. The method of claim 10, wherein the dimensions of the raised portion of the buried oxide interface are dependent on the gate width.

13. The method of claim 6, further comprising the step of forming oxide spacers in the first recess of the silicon on insulator layer.

14. The method of claim 6, wherein the elevated source and drain regions are formed by utilizing oxide spacers for gate source and drain isolation.

15. A raised source and drain field effect transistor comprising:
- a gate region in a layer of silicon of a first thickness sufficient for silicidation of contacts, said gate region having a second thickness corresponding to a desired channel thickness, wherein the second thickness is less than the first thickness;
- a gate structure at said gate region;
- drain and source structures adjacent said gate structure in regions of said first thickness; and
- a channel having the desired channel thickness uniformly over the entire distance between the source and drain structures.

16. The raised source/drain field effect transistor of claim 15, wherein the second thickness is dependent on the length of the gate region.

17. The raised source/drain field effect transistor of claim 16, wherein the second thickness is dependent on the width of the gate region.

* * * * *